US007372721B2

(12) United States Patent
Sachdev et al.

(10) Patent No.: US 7,372,721 B2
(45) Date of Patent: May 13, 2008

(54) SEGMENTED COLUMN VIRTUAL GROUND SCHEME IN A STATIC RANDOM ACCESS MEMORY (SRAM) CIRCUIT

(76) Inventors: Manoj Sachdev, 585 Leighland Drive, Waterloo, Ontario (CA) N2T 2K2; Mohammad Sharifkhani, 910-66 Mooregate Crescent, Kitchener, Ontario (CA) N2M 5E6

( * ) Notice: Subject to any disclaimer, the term of this patent is extended or adjusted under 35 U.S.C. 154(b) by 16 days.

(21) Appl. No.: 11/552,655

(22) Filed: Oct. 25, 2006

(65) Prior Publication Data
US 2007/0217262 A1 Sep. 20, 2007

Related U.S. Application Data

(60) Provisional application No. 60/729,936, filed on Oct. 26, 2005.

(51) Int. Cl.
*G11C 7/00* (2006.01)
(52) U.S. Cl. ...................................... 365/154; 365/156
(58) Field of Classification Search ................ 365/154, 365/156, 226; 326/34; 327/554
See application file for complete search history.

(56) References Cited

U.S. PATENT DOCUMENTS

| 6,560,139 | B2 | 5/2003 | Ma et al. |
| 6,839,299 | B1 * | 1/2005 | Bhavnagarwala et al. .. 365/226 |
| 6,977,519 | B2 * | 12/2005 | Bhavnagarwala et al. .... 326/34 |
| 7,259,986 | B2 * | 8/2007 | Bhavnagarwala et al. ...................... 365/185.02 |
| 7,307,899 | B2 * | 12/2007 | Khellah et al. ........ 365/189.11 |
| 2005/0018474 | A1 | 1/2005 | Sohn |
| 2005/0157537 | A1 | 7/2005 | Wei et al. |

OTHER PUBLICATIONS

PCT International Search Report and Written Opinion dated Feb. 19, 2007 for corresponding PCT Application No. PCT/CA2006/001741.

* cited by examiner

*Primary Examiner*—Vu A. Le
(74) *Attorney, Agent, or Firm*—Gowling Lafleur Henderson LLP

(57) ABSTRACT

A static random access memory (SRAM) cell array is provided that reduces leakage current. The SRAM cell array is configured in a plurality of columns. Each of the columns comprises: a column virtual ground node; a column switch for selectively coupling the column virtual ground node to one of a ground or a nominal low voltage; and a plurality of segments. Each of the segments comprises: a segment virtual ground node; a plurality of SRAM cells including a virtual ground signal coupled to the segment virtual ground node; and a virtual ground switch for selectively coupling the segment virtual ground node to one of either a nominal low voltage or the column virtual ground node. A method for operating the SRAM cell array is also described.

19 Claims, 7 Drawing Sheets

SEGMENTED COLUMN VIRTUAL GROUND SCHEME IN A STATIC RANDOM ACCESS MEMORY (SRAM) CIRCUIT

The present invention relates generally to Static Random Access Memory (SRAM) cell arrays and specifically to a scheme that improves power performance of memory cells in the cell arrays. This application claims priority from U.S. Provisional Application No. 60/729,936, filed Oct. 26, 2005.

BACKGROUND OF THE INVENTION

Embedded memories have been a vital component of system-on-chip solutions for decades. However, memory blocks occupy a significant portion of the chip's die area, making it an important component in terms of area and power consumption. With increasing demand for battery-operated applications, methods for reducing power consumption of the memory blocks have received significant interest. In particular, static random access memory (SRAM) has been receiving a lot of attention.

Six-transistor SRAM cells are preferred for many applications because of their high speed and small area. This configuration, however, suffers from high stand-by power consumption due to leakage. Additionally, the power consumption of the write operation is high because of a high swing of the bit-line voltages. Specifically, for a write operation, the swing of the bit-line voltage should be high enough to overwrite the cell's data. Such a swing makes the write operation a power consuming operation. To overcome these problems, several methods have been proposed.

One approach, as described by H. Mizuno and T. Nagano in "Driving source-line cell architecture for sub-1-v high-speed low-power applications," IEEE J. Solid-State Circuits, vol. 31, pp. 552-557, 1996 teaches a virtual grounding scheme. As taught by Mizuno, the source of the drive transistors is connected to a virtual ground instead of to VSS. The drive capability of the drive transistors and the leakage current of the cell can be controlled by controlling the virtual ground voltage. For a data retention mode, the virtual ground is kept close to the supply voltage VDD to reduce the leakage current. This modification makes the voltage high and voltage low of the cell close to each other. For a read operation, the virtual ground decreases substantially. This operation boosts the strength of the drive transistors that need to discharge a bit-line voltage. For a write operation, the virtual ground goes to a high impendence mode and destroys the data of the cell. This operation charges up all node voltages of the cell to the supply voltage VDD, leaving the transistors in a weak cut-off operating region. Under this condition, a low voltage swing on the bit-line can produce sufficient charge within the cell nodes to write the data onto the cell. The virtual ground of a group of transistors can be connected to share the control circuitry for that node.

As described by N. Shibata in "A switched virtual-gnd level technique for fast and low power srams," IEICE Trans. Electron., vol. E80-C, pp. 1598-1607, 1997, a method for using the virtual grounding scheme to reduce the leakage current and bit-line voltage swing is proposed. As taught by Shibata, a virtual ground is shared among the cells in the same column and controlled using a column decoder. When the cells of a specific column are in the data retention mode, the virtual ground of that column is close to the supply voltage. When a cell is a target of the read operation, the virtual ground of the whole column is lowered to the actual ground VSS to increase the drive of the cell. However, since the virtual ground is connected to all cells in the column, it is highly capacitive. Accordingly, fluctuating the voltage of the virtual ground node is power consuming. Thus, the read operation of this scheme is a high-power consuming operation.

As described by K. Kanda, S. Hattori, and T. Sakurai, in "90% write power-saving SRAM using sense-amplifying memory cell," IEEE J. Solid-State Circuits, vol. 93, pp. 929-933, 2004, an alternative virtual grounding scheme is proposed. As taught by Sakurai, the virtual grounds of the cells on the same row are connected and controlled using a row decoder. The virtual ground provides sufficient voltage swing for the cell to retain data in the data retention mode while keeping the transistors in a low-leakage operating region. In write operations, the swing of the bit-lines is reduced at the expense of destroying data of the cells in the same row. Therefore, this scheme is not useful in practical cases in which we are interested in having multiple words in the same row. Further, since the virtual ground is connected to all cells in the row, it is highly capacitive. Accordingly, fluctuating the voltage of the virtual ground for both read and write operations consumes significant power.

Thus it can be seen that there is a need for a virtual grounding scheme that overcomes at least some of the problems of the prior art.

SUMMARY OF THE INVENTION

Through the introduction of a segmented virtual grounding scheme, leakage current of the memory cells is reduced. Further, a reduced bit-line swing voltage enables lower power write operation. Yet further, this scheme inhibits discharging unselected bit-lines, which results in low power read operation.

In accordance with an aspect of the present invention there is provided a static random access memory (SRAM) cell array configured in a plurality of columns, each of the columns comprising: a column virtual ground node; a column switch for selectively coupling the column virtual ground node to one of a ground or a nominal low voltage; and a plurality of segments, each segment comprising: a segment virtual ground node; a plurality of SRAM cells including a virtual ground signal coupled to the segment virtual ground node; and a virtual ground switch for selectively coupling the segment virtual ground node to one of either a nominal low voltage or the column virtual ground node.

In accordance with a further aspect of the present invention there is provided a method for activating a cell in a SRAM cell array configured in a plurality of columns, each of the columns arranged in a plurality of segments, each of the segments comprising a plurality of cells, the method comprising the steps of: providing a column virtual ground for each column, the column virtual ground being connected to a nominal low voltage; providing segment virtual ground signal for each segment, the segment virtual ground being connected to a nominal low voltage; coupling the segment virtual ground to the column virtual ground in response to a segment select signal; coupling the column virtual ground to a ground signal in response to a column select signal and a read signal; and activating the cell by asserting a word-line access signal.

BRIEF DESCRIPTION OF THE DRAWINGS

An embodiment of the present invention will now be described by way of example only with reference to the following drawings in which.

DETAILED DESCRIPTION OF THE PREFERRED EMBODIMENT

Figure 1:
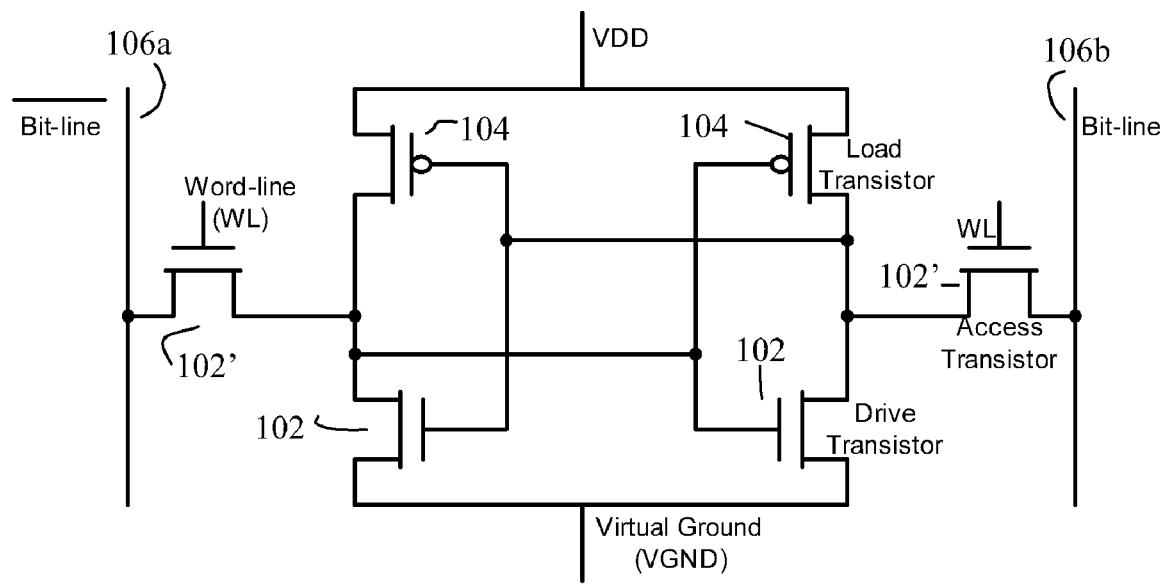
FIG. 1 is a circuit diagram of a cell having a virtual ground.

For convenience, like numerals in the description refer to like structures in the drawings. Referring to FIG. 1, a standard six-transistor SRAM cell is illustrated generally by numeral 100. The cell 100 comprises a pair of n-type drive transistors 102 and a pair of p-type load transistors 104 in a cross-coupled configuration. A further pair of n-type access transistors 102' couples the cell 100 to a complementary bit-line pair 106a and 106b. The source of the drive transistors 104 is coupled to a virtual ground VGND and the source of the load transistors 102 is coupled to a supply voltage VDD.

The cell 100 is coupled to the bit-line pair 106a and 106b in a response to a word-line control signal WL from a row decoder (not shown). Accordingly, when the word-line control signal WL is active, the cell 100 is electrically connected to the bit-line pair 106a and 106b.

Figure 2:
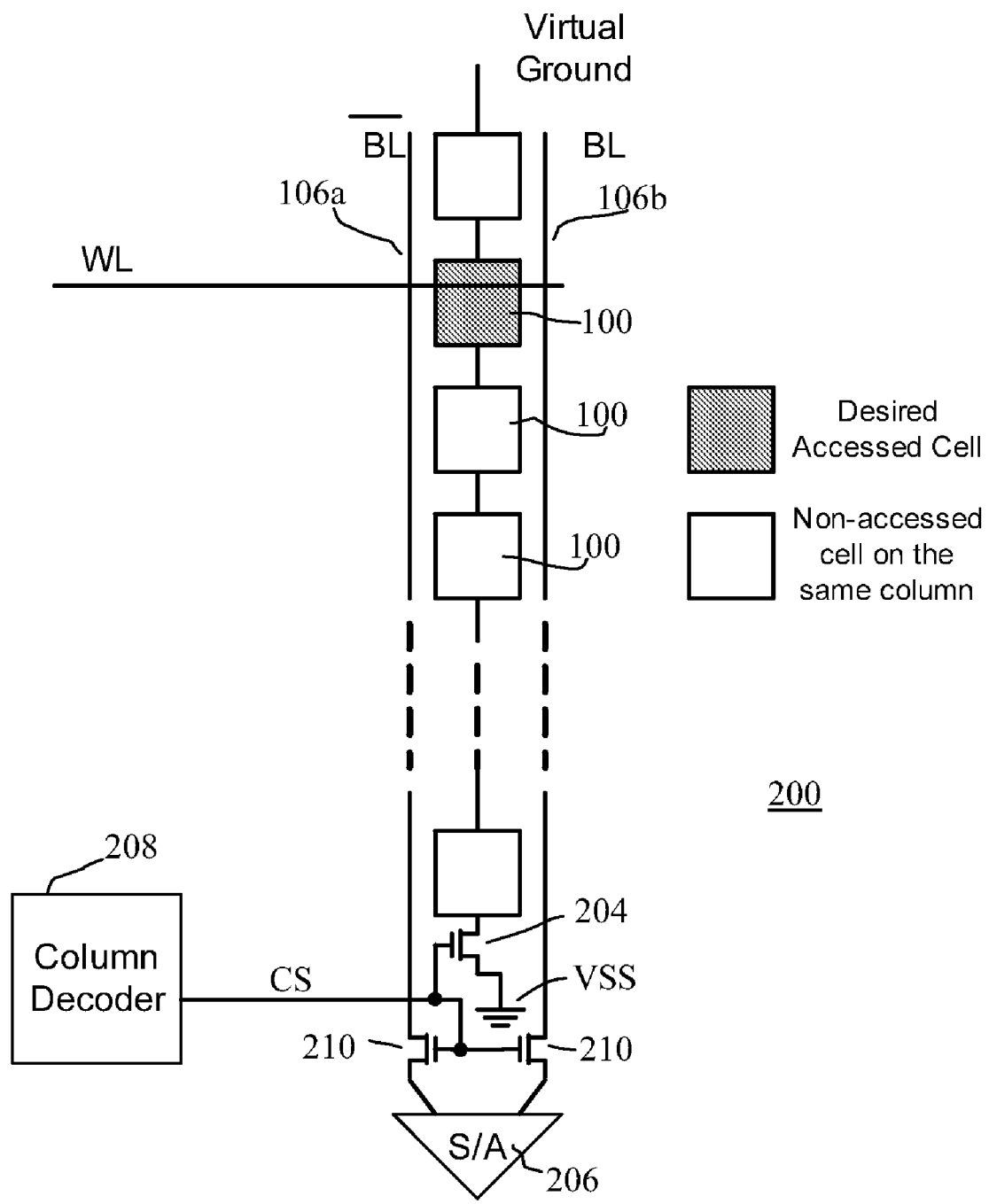
FIG. 2 is a diagram showing a prior art implementation of a column-based virtual grounding scheme.

Referring to FIG. 2, a standard column of an SRAM block array using a virtual ground scheme is illustrated generally by numeral 200. The column 200 includes a plurality of cells 100 and a common bit-line pair 106a and 106b. Each of the cells 100 is coupled to either a virtual ground VGND or a ground 202 by a ground switch 204. The ground switch 204 is responsive to a column select signal CS from a column decoder 208. The column select signal CS is a logical combination of a column address and a read signal. Bit-line switches 210 are used to couple each of the bit-line pair 106a and 106b to a sense amplifier 206. The bit-line switches 210 are also responsive to the column select signal CS. Accordingly, when the column select signal CS is active, all the cells 100 in the column are connect to ground VSS and the bit-line pair 106a and 106b is electrically connected to the sense amplifier 206.

In accordance with an embodiment of the preset invention, a segmented virtual grounding technique is provided for an SRAM block array. Each column in the array contains several segments, and each segment comprises of a group of cells with a shared virtual ground. The shared virtual ground of each segment is controlled using a virtual ground switch. The virtual ground switch couples the virtual ground of the corresponding segment to a column virtual ground when one of the cells on the segment is accessed. The column virtual ground is grounded if the cell is accessed for a read operation otherwise it remains at a nominal, non-zero voltage. Therefore, the cell can discharge a bit-line pair only if it is accessed for the read operation. The non-zero virtual ground voltage maintain the source voltage of driver transistors at a higher value than standard implementations, which reduces the leakage current since all transistors are in sub-threshold region. Details of this embodiment are described below.

Figure 3:
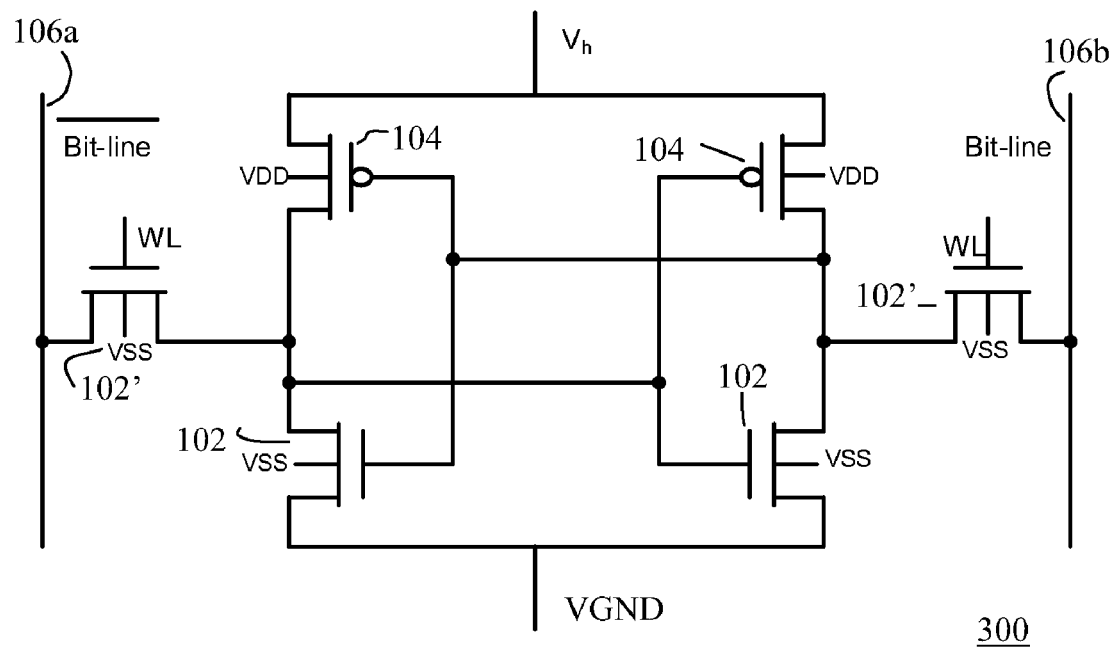
FIG. 3 is a further circuit diagram of a cell having a virtual ground.

Referring to FIG. 3, a six-transistor SRAM cell in accordance with an embodiment of the present invention is illustrated generally by numeral 300. The layout of the cell 300 is similar to the cell 100 shown in FIG. 1. However, the source of the drive transistors 104 is coupled to a virtual ground VGND and the source of the load transistors 102 is coupled to a high voltage $V_H$. In operation, the virtual ground VGND alternates between ground VSS and a nominal low voltage $V_L$. The high voltage $V_H$ is greater than the nominal low voltage $V_L$, but lower that the supply voltage VDD.

The bodies of the load transistors 104 are connected to VDD, which is the highest voltage available. Conversely, the bodies of the drive transistors 102 and access transistors 102' are connected to ground VSS. The benefits of this arrangement will be discussed later, with reference to the read, write and retention modes of the cell 300.

Figure 4:
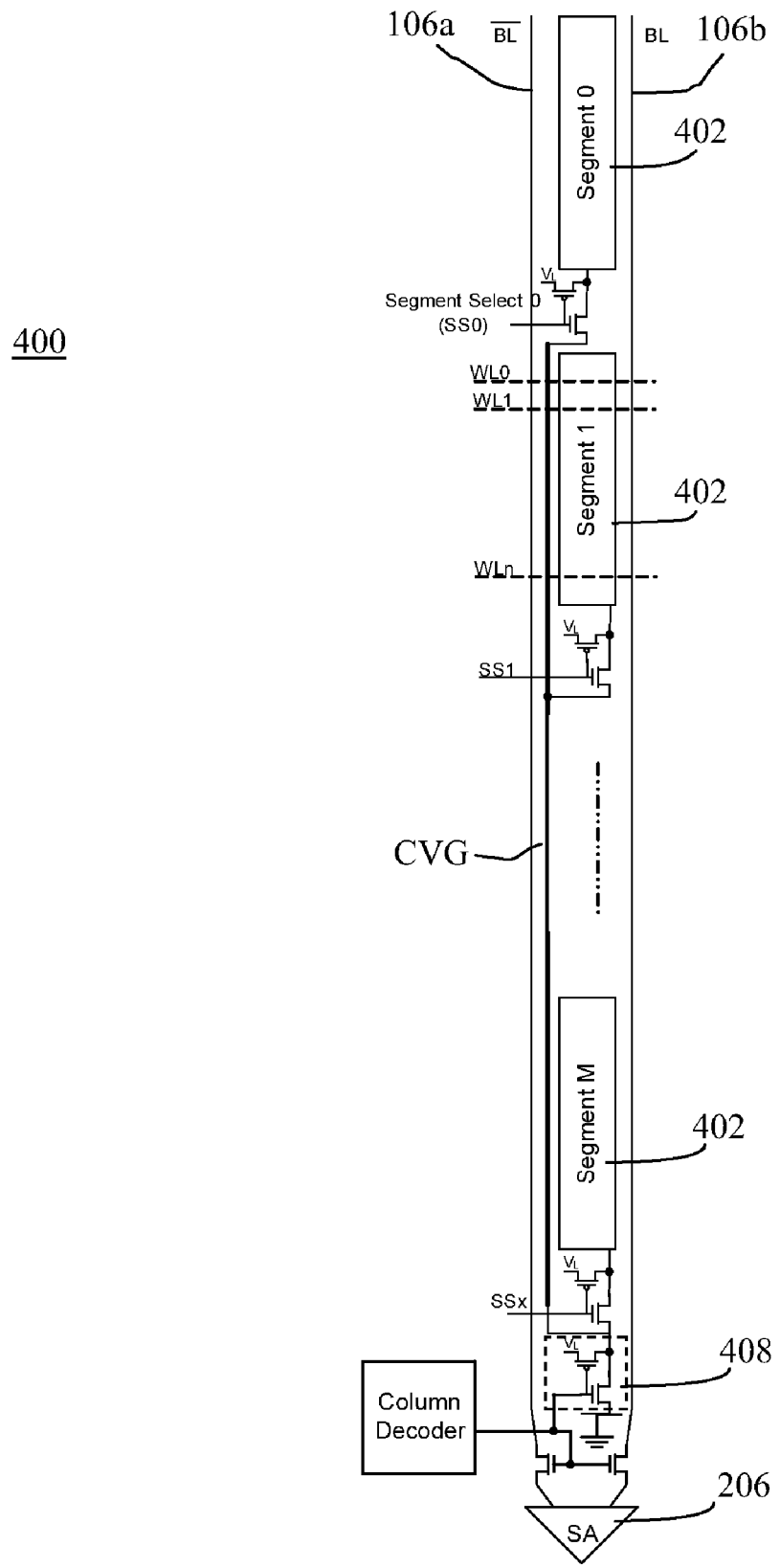
FIG. 4 is a diagram showing an embodiment of the proposed column-based virtual grounding scheme.

Referring FIG. 4, a column of an SRAM block array using a virtual ground scheme in accordance with an embodiment of the present invention is illustrated generally by numeral 400. The architecture is based on column segmentation of the virtual ground node VGND of the memory cells 300. Accordingly, the column 400 is partitioned into M segments 402. Each segment 402 comprises N cells 300.

Figure 5:
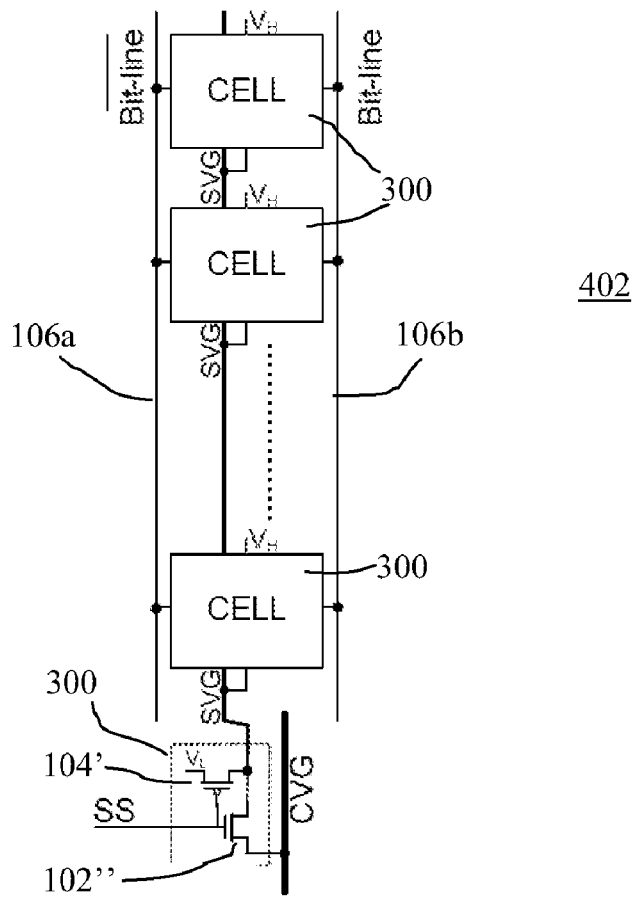
FIG. 5 is a diagram showing detail of segment shown in FIG. 4.

Referring to FIG. 5, a more detailed diagram of a segment 402 is illustrated. The high voltage $V_H$ for each cell 300 in the segment 402 is coupled to an appropriate voltage source. The virtual ground VGND for each cell 300 in the segment 402 is coupled to a common segment virtual ground node SVG.

A virtual ground switch 504 couples the segment virtual ground node SVG to either a column virtual ground node CVG or the nominal low voltage $V_L$. In the present embodiment, the virtual ground switch 504 comprises inverter, which drives the segment virtual ground node SVG to either $V_L$ or to the voltage of the column virtual ground CVG node, depending on a control signal. Specifically, an n-type transistor 102" is coupled between the segment virtual ground node SVG and the column virtual ground node CVG, and a p-type transistor 104' is coupled between the segment virtual ground SVG node and the low voltage $V_L$. Both transistors 102" and 104' are gated by a segment select signal SS, which acts as the control signal. The p-type transistor 104' acts as a voltage limiter for limiting the segment virtual ground node SVG to the nominal low voltage $V_L$ when the segment select signal SS is inactive. Accordingly, it will be appreciated that other components, such as diodes, other transistors, and transistors in a diode configuration may be used lieu of the p-type transistor 104'.

Thus it can be seen that if the virtual ground switch 504 of a segment 402 is activated, the segment virtual ground node SVG is electrically coupled to the column virtual ground node CVG. Otherwise, the segment virtual ground SVG node maintains the nominal low voltage $V_L$.

Referring once again to FIG. 4, the column virtual ground node CVG is coupled to either the nominal low voltage $V_L$ or the ground voltage VSS via a column ground switch 408. In the present embodiment, the configuration of the column ground switch 408 is the same as the virtual ground switch 504. The column ground switch 408 is controlled by the column select signal CS. Therefore, the column ground switch 408 is only activated for read operations. The column select signal CS also couples the bit-line pair 106a and 106b to a data bus (not shown) via the sense amplifier 206.

Accordingly, if the column ground switch 408 is activated, the column virtual ground node CVG is electrically coupled to ground VSS. Otherwise, the column virtual ground node CVG maintains its nominal low voltage $V_L$.

Figure 6:
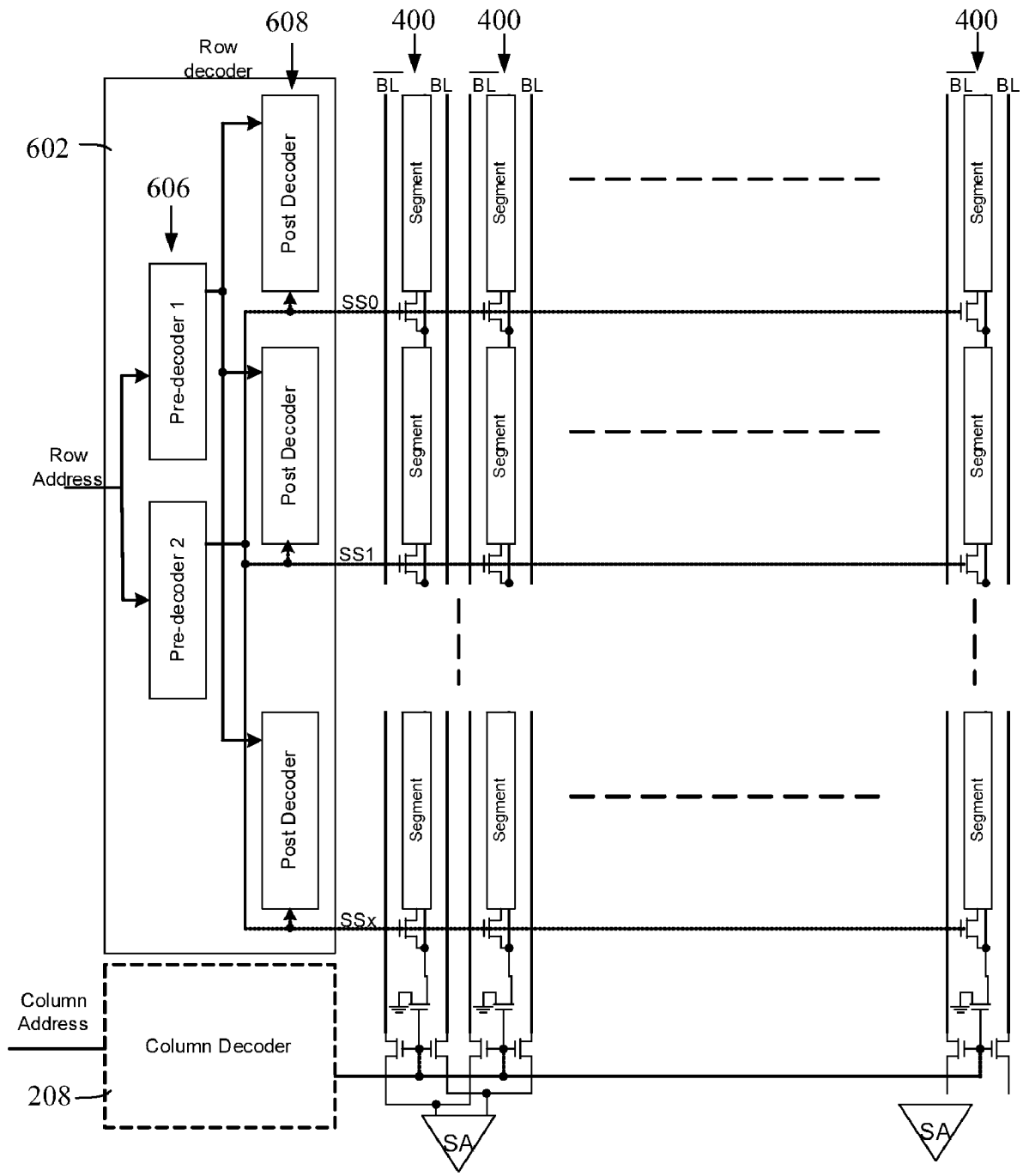
FIG. 6 is a diagram showing an embodiment of a chip level implementation of the proposed column-based virtual grounding scheme.

Referring to FIG. 6, a diagram of an SRAM cell array in accordance with an embodiment of the invention is illustrated generally by numeral 600. For ease of illustration, the word line control signals WL and virtual ground switches 504 are not shown. The cell array 600 includes a plurality of columns 400 and address decoder circuitry. The address decoder circuitry includes a row decoder 602 and a column decoder 208. The row decoder 602 and column decoder 208 are well known in the art and need not be described in detail.

The column decoder 208 receives a column address for reading a target cell. The column decoder 208 determines which of the columns 400 includes the target cell and activates the column 400 accordingly.

The row decoder 602 receives a row address for the target cell. In the present embodiment, the row decoder 602 comprises two levels of decoding: a first level of pre-decoders 606; and a second level of post-decoders 608. As is known in the art, the pre-decoders 606 carry out a pre-decoding step in which a memory cell row area is determined. That is, the pre-decoders 606 determine which of the post-decoders 608 includes the row address for the target cell. The post-decoders, which follow the pre-decoders, determine the particular memory cell row in which the memory cells are located. Such structuring of the row decoder allows the required chip area to be reduced and enhances performance of the decoding device, as is well known.

In the present embodiment, the segments 402 are arranged to take advantage of the pre-decoder 606/post-decoder 608 structure of the row decoder 602. That is, the segments 402 are configured to correspond with the post-decoders 608. For example, if each post-decoder 608 decodes a portion of the row address for eight (8) rows, the corresponding size of each segment 402 is eight (8) cells. This arrangement facilitates use of the output of the pre-decoder 606 as the select signal SS for each of the segments 402, thereby reducing the requirement for extra control circuitry. This advantage is beneficial given the drive to increase memory capacity and decrease chip-size.

The following describes the operational modes of the cells in the SRAM cell array 600 described above. Typically, there are three types of operational modes: data retention mode; read mode; and write mode.

Data Retention Mode. In the data retention mode, the data in a cell 300 is being retained and is not being accessed for either a read or a write operation. Accordingly, all segments 402 that do not have an activated segment select signal SS are in this mode. Other segments 402 may be in this mode even if their segment select signal SS is activated. For example, during a read operation, segments 402 in different columns 400 sharing a common segment select signal SS will remain in the data retention mode if their corresponding column select signal CS is not activated.

Referring once again to FIG. 3, when the cell 300 is not accessed, the word-line control signal WL is connected to ground VSS. The sources of the p-channel load transistors 104 are connected to $V_H$, the high voltage of the cell 300. The sources of the drive transistors 102 are connect to $V_L$, the nominal low voltage of cell 300. Therefore, it will be appreciated that $V_H$ represents a logic '1' and $V_L$ represents a logic '0' in the cell 300. Since $V_H$ and $V_L$ are not equal to the body voltage of the load 104 and drive 102 transistors respectively, all of the transistors 104 and 102 are reverse body biased. Simulation results demonstrate that the threshold voltage $V_{TH}$ of the transistors 104 and 102 can be increased significantly with reverse body bias. Assuming the voltage across a cell ($V_H-V_L$), is close to $V_{TH}$ and is approximately one third of the standard supply voltage (VDD−VSS), the voltage Vgs across the gate-source of the drive 104 and load 102 transistors is three times smaller than the voltage Vgs of the same transistors in the conventional configuration. Accordingly, the leakage current of the drive and load transistors 104 and 102 may be significantly reduced. Further, the leakage current of the access transistors 102' may also reduced provided that the pre-charge voltage of the bit-line pair 106a and 106b is at $V_H$, which results in negative voltage $V_{gs}$ over both access transistors 102'.

According to the teachings of the art, leakage current has an exponential relationship with the voltages $V_{gs}$ and $V_{TH}$, such that the leakage current decreases as the voltage Vgs decreases and $V_{TH}$ increases, as shown in Equation. 1.

$$I_s = I_0 \cdot e^{(V_{gs}-V_{TH})/nV_T}(1-e^{-V_{ds}/V_T})$$ (Equation 1)

Accordingly, it will be appreciated that the leakage current of the cell 300 is minimized by keeping $V_H$ and $V_L$ at mid-rail (between VDD and VSS) and the body of the drive and access transistors at higher and lower voltages (VDD and VSS respectively). In other words, $V_H$ is less than VDD and $V_L$ is larger than VSS.

Further, under these conditions, all six transistors 102 and 104 of the cell 300 are in the sub-threshold region. Accordingly, if the cell 300 is accessed, the drive transistors 104 are unable to discharge the pre-charged bit-line pair 106a and 106b. Therefore, dynamic power associated with unselected columns in both read and writes operations may be saved.

Read Mode. During a read operation, the column select signal CS for the desired column is activated. Accordingly, the column virtual ground CVG of the selected column is coupled to ground VSS. Further, the segment select signal SS for the desired segment 402 within the column is activated, coupling a corresponding segment virtual ground SVG with the column virtual ground CVG.

This series of event provides sufficient strength to the drive transistors 102 to discharge the bit-line pair 106a and 106b. Specifically, the drive transistors 102 become stronger because the body effect is eliminated and, at the same time, the voltage $V_{gs}$ of the drive transistors 102 increases. Accordingly, one of the bit-line pair 106a or 106b is discharged from its pre-charge voltage in accordance with the charge stored in the cell 300. This change is detected by the sense-amplifier 206 and output to the data bus as is known in the art.

As described above, the segment virtual ground SVG of a given segment 402 is only reduced to ground VSS if the segment 402 includes a cell to be read. The segment virtual ground nodes SVG of the rest of the segments 402 are maintained at the nominal low voltage $V_L$. The activation of only one segment 402 per column limits the discharge of several capacitances. That is, the internal capacitances of unselected segments in the same column are not discharged. Similarly, the internal capacitances of the unselected cells 300 on the same row are also not discharged. Therefore, the present embodiment saves power compared to previously implemented schemes that discharge the internal cell capacitance of an entire row or column. As previously mentioned, since neighbouring cells in the same row as an activated cell are maintained at the nominal voltages $V_L$ and $V_H$, they are not strong enough to discharge their bit-line pairs 106a and 106b. Thus, the power consumption is further reduced.

Write Mode. During a write operation, the cell 300 supply voltages are maintained at the nominal voltages $V_L$ and $V_H$, keeping the drive and load transistors 102 and 104 in the weak cut-off operating region. The voltage of the word-line control signal WL is boosted such that the access transistors 102' can properly transfer the charge between the cell internal nodes and the bit-line pair 106a and 106b.

That is, the word-line control signal WL voltage is boosted such that the access transistors 102' get enough strength relative to the weak internal drive 102 and load 104 transistors of the cell 300. This effect reduces the voltage swing on the bit-line pair 106a and 106b required to write the data to the cell for a successful write operation. Reduction of the voltage swing on the bit-line pair 106a and 106b is a source of power reduction as the bit-line pair capacitance is significant.

Further, in contrast to the prior art in which the data of the adjacent cells in the same row is destroyed in a write operation, the data of the neighbouring cells in the present embodiment is retained. This feature is achieved by proper selection of the initial pre-charge voltage of the bit-lines for the non-selected (and yet accessed) adjacent columns relative to the overdrive of the word-line control signal WS. Proper selection helps the neighbouring cells retain the data even if the accessed transistors are active and cells have nominal voltages. This feature lets the new architecture have multiple words in the same row.

Figure 7:
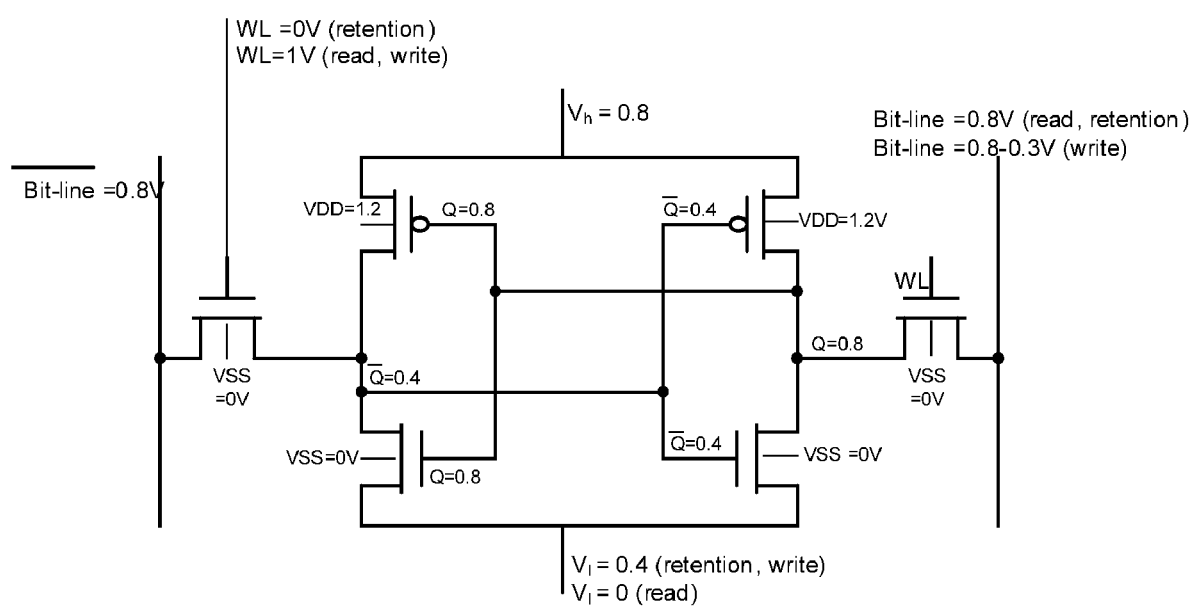
FIG. 7 is a circuit diagram showing the SRAM cell voltage values used in an example implementation.

As an example, circuit simulations were conducted for a typical cell in a Complementary Metal Oxide Semiconductor (CMOS) 130 nm technology to verify the architectural and circuit concepts. The simulation is illustrated in FIG. 7. The values of $V_H$ and $V_L$ were selected to be 0.8V and 0.4V, respectively. These values are the nominal voltages of the cell in the data retention and write operations. The VDD and VSS of the chip are 1.2V and 0V, respectively, while the word line voltages for both read and write operations are 1V. The pre-charge for the cell of the bit-lines is chosen to be equal to $V_H$, and the bit-line swing for the write operation is 0.3V.

Figure 8:
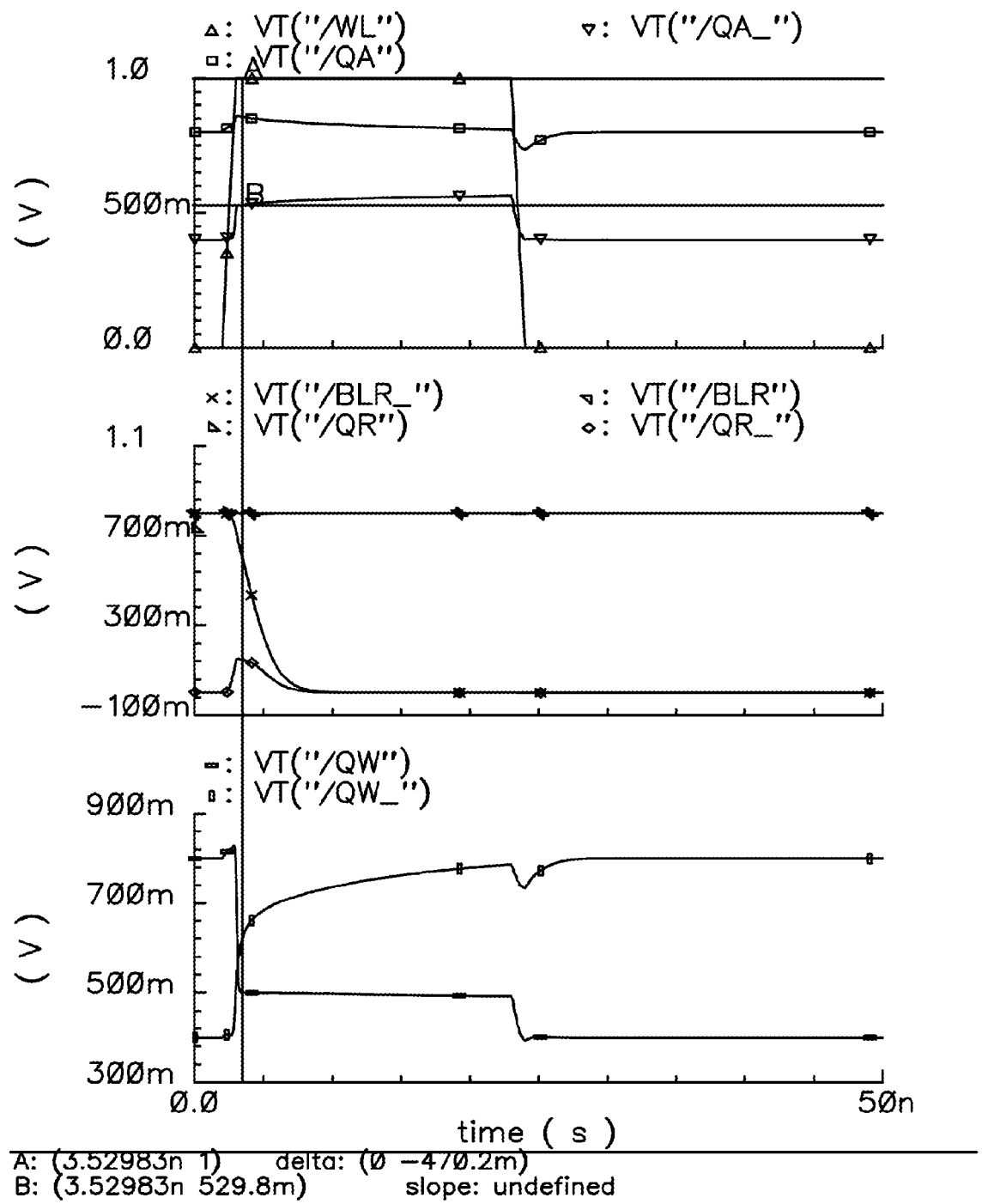
FIG. 8 is a waveform graph showing the simulation results of the example

Referring to FIG. 8, time domain waveforms of a cell 300 for each of the data retention, read, and write operations are shown. The waveform in FIG. 8a illustrates internal node voltages of a non-selected yet accessed cell operating under nominal voltage conditions. Accordingly, the word-line control signal WL is asserted, but the column select signal CS is not. As can be seen from FIG. 8a, the cell is able to retain its data.

The waveform in FIG. 8b illustrates internal node and bit-line voltages of a cell during the read operation. From the figure it is evident that the drive transistors are strong enough to fully discharge the bit-line pair if the cell is accessed for long enough time, even though it may not be necessary to do so.

The waveform illustrated in FIG. 8c illustrates internal node voltages for a write operation. From the figure, it is apparent that the cell internal node voltages are flipped after the cell is accessed, indicating a successful write operation.

Table 1 below compares the efficiency of the scheme described above in terms of power consumption as compared with previously implemented schemes.

TABLE 1

|  | SVGND | [Sak] | Unit |
| --- | --- | --- | --- |
| Retention (leakage) | 10 pA | 16 pA | Amp/Cell |

TABLE 1-continued

|  | SVGND | [Sak] | Unit |
| --- | --- | --- | --- |
| Read | 5 fJ | 14 fJ | Energy/Bit/Operation |
| Write | 7.7 fJ | 14.8 fJ | Energy/Bit/Operation |

For the purpose of this table, the previous schemes are mapped to the same process technology (i.e. CMOS 130 nm) to make a fair comparison. The data was generated using similar process parameters and includes the power consumption of all parasitic capacitances for each scheme. The same memory size is assumed for both cases. It can be seen that the proposed method is capable of improving power savings for all three operating modes: read; write; and data retention. The concept of localization of power supply injection using segmented virtual grounding is one of the primary reasons for such an achievement.

Although the scheme described above make reference to specific embodiments, a person of ordinary skill in the art will appreciate it that other implementations may be possible without departing from the scope of the invention as defined in the attached claims.

For example, although 0.8V and 0.4V are provided as example values of $V_H$ and $V_L$, it has been shown that 0.9V and 0.5V, respectively, may also be used. Accordingly, other values may be preferred, depending on the implementation, as will be appreciated by a person of ordinary skill in the art.

Further, although the previous embodiment was described using the cell architecture described in FIG. 3, it may also be possible to implement the invention using the cell described in FIG. 100. Although not all of the benefits described above may be realized, it may still improve the power performance of the cell array.

Yet further, it will be apparent to a person of ordinary skill in the art that the number of segments 402 per column 400, as well as the number of cells 400 per segment can vary depending on the implementation. Although the previous embodiment discussed configuring the segments 402 to correspond with the row decoder, this need not be true.

Yet further, although the example implementation was provided for Metal-Oxide-Semiconductor Field-Effect-Transistors (MOSFETs), other types of transistors may also be utilized. This includes other types of FETs as well as Bipolar Junction Transistors (BJTs) and a number of other types of transistors that are well known in the art.

What is claimed is:

1. A static random access memory (SRAM) cell array configured in a plurality of columns, each of the columns comprising:
   a column virtual ground node;
   a column switch for selectively coupling the column virtual ground node to one of a ground or a nominal low voltage; and
   a plurality of segments, each segment comprising:
      a segment virtual ground node;
      a plurality of SRAM cells including a virtual ground signal coupled to the segment virtual ground node; and
      a virtual ground switch for selectively coupling the segment virtual ground node to one of either a nominal low voltage or the column virtual ground node.

2. The SRAM cell array of claim 1, wherein each cell comprises a pair of load transistors and a pair of drive transistors in a cross coupled configuration for storing data;

a pair of access transistors for coupling the SRAM cell to a bit-line pair; a high voltage source coupled to the load transistors' source; and the virtual ground signal coupled to the drive transistor's source.

3. The SRAM cell array of claim 2, further comprising a row decoder and a column decoder.

4. The SRAM cell array of claim 3, wherein the column switch is activated in response to a column select signal from the column decoder.

5. The SRAM cell array of claim 4, wherein the column select signal is a logical combination of a read signal and a column address.

6. The SRAM cell array of claim 3, wherein the virtual ground switch for each of the plurality of segments is activated in response to an output of the row decoder.

7. The SRAM cell array of claim 6, wherein the row decoder includes at least one pre-decoder and at least one post-decoder, and the virtual ground switch for each of the plurality of segments is activated in response an output of the at least one pre-decoder.

8. The SRAM cell array of claim 2, wherein the high voltage source is lower than a supply voltage to the cell array.

9. The SRAM cell array of claim 8, wherein a body voltage of each of the load transistors is coupled to the supply voltage.

10. The SRAM cell array of claim 8, wherein a body voltage of each of the drive transistors is coupled to a ground voltage lower than the nominal low voltage.

11. The SRAM cell array of claim 2, wherein each cell comprises a plurality of MOSFETs.

12. The SRAM cell array of claim 2, wherein the virtual ground switch comprises:
a switch configured to couple the segment virtual ground with the column virtual ground; and
a voltage limiter configured to couple the segment virtual ground with a nominal low voltage source to ensure that the virtual ground does not rise above a predefined voltage.

13. The SRAM cell array of claim 12, wherein the switch is a MOSFET.

14. The SRAM cell array of claim 13, wherein the voltage limiter is a complementary type of MOSFET to the MOSFET used for the switch.

15. The SRAM cell array of claim 12, wherein the voltage limiter is diode.

16. The SRAM cell array of claim 2 wherein the column virtual ground of non-selected columns remain at the nominal low voltage.

17. A method for activating a cell in a SRAM cell array configured in a plurality of columns, each of the columns arranged in a plurality of segments, each of the segments comprising a plurality of cells, the method comprising the steps of:
providing a column virtual ground for each column, the column virtual ground being connected to a nominal low voltage;
providing segment virtual ground signal for each segment, the segment virtual ground being connected to a nominal low voltage;
coupling the segment virtual ground to the column virtual ground in response to a segment select signal;
coupling the column virtual ground to a ground signal in response to a column select signal; and
activating the cell by asserting a word-line access signal.

18. The method of claim 17, wherein the segment select signal is generated in response to a pre-decoder output of a row decoder.

19. The method of claim 17, wherein the column select signal is a logical combination of a column address and a read signal.

* * * * *